(12) United States Patent
Baumgartl et al.

(10) Patent No.: US 7,477,057 B2
(45) Date of Patent: Jan. 13, 2009

(54) MAGNETIC RESONANCE SYSTEM WITH COMPONENTS ALLOWING UPGRADE CAPABILITY

(75) Inventors: Rudi Baumgartl, Erlangen (DE); Nikolaus Demharter, Dormitz (DE); Georg Pirkl, Dormitz (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/936,173

(22) Filed: Nov. 7, 2007

(65) Prior Publication Data
US 2008/0136417 A1 Jun. 12, 2008

(30) Foreign Application Priority Data
Nov. 7, 2006 (DE) .................. 10 2006 052 437

(51) Int. Cl.
*G01V 3/00* (2006.01)
(52) U.S. Cl. ....................... 324/322; 324/318
(58) Field of Classification Search ......... 324/300–322; 600/407–422
See application file for complete search history.

(56) References Cited

U.S. PATENT DOCUMENTS

| | | | |
|---|---|---|---|
| 5,170,123 A | 12/1992 | Holland et al. | |
| 6,157,621 A * | 12/2000 | Brown et al. | 370/310 |
| 6,198,287 B1 | 3/2001 | Heiserholt et al. | |
| 6,633,162 B2 * | 10/2003 | Zhang et al. | 324/322 |
| 7,378,844 B2 * | 5/2008 | Watkins et al. | 324/304 |
| 2003/0214953 A1* | 11/2003 | El-Demerdash et al. | 370/400 |
| 2007/0043597 A1* | 2/2007 | Donaldson | 705/3 |
| 2007/0091428 A1* | 4/2007 | Wilson et al. | 359/391 |
| 2008/0146914 A1* | 6/2008 | Polzin et al. | 600/420 |

* cited by examiner

*Primary Examiner*—Brij B Shrivastav
(74) *Attorney, Agent, or Firm*—Schiff Hardin LLP

(57) ABSTRACT

A magnetic resonance system has components that include a magnetic field generation unit for generation of a basic magnetic field, gradient coils for generation of a field gradient as well as a radio-frequency coil arrangement with a number of radio-frequency coils for transmission and reception of radio-frequency signals. These components can respectively be activated according to a sequence via at least one digital module and at least one analog module. The analog modules are arranged externally to a control computer controlling the digital modules. The digital modules also are arranged externally to the control computer and are associated with the analog module or modules controlled by said digital modules. A data network is provided for communication between the digital modules and the control computer and a synchronous network is provided for synchronization of the digital modules and the control computer.

23 Claims, 4 Drawing Sheets

MAGNETIC RESONANCE SYSTEM WITH COMPONENTS ALLOWING UPGRADE CAPABILITY

BACKGROUND OF THE INVENTION

1. Field of the Invention

The invention concerns a magnetic resonance system of the type having components, that include a magnetic field generation unit for generation of a basic magnetic field, gradient coils for generation of a field gradient as well as a radio-frequency coil arrangement with a number of radio-frequency coils for transmission and reception of radio-frequency signals; the components being respectively activated according to a sequence via at least one digital module and at least one analog module; with the analog modules being arranged external to a control computer that controls the digital modules.

2. Description of the Prior Art

Modern magnetic resonance systems embody a number of components that must be activated in the course of a measurement procedure (in particular a sequence) while observing fixed temporal correlations. Among these components are, for example: a magnetic field generation unit for generation of a basic magnetic field; gradient coils for generation of a field gradient; and a radio-frequency coil arrangement with a number of radio-frequency coils for transmission and reception of radio-frequency signals. Since such components typically are operated in an analog manner but the activation proceeds in a digital manner, a digital module and an analog module are provided on the activation path to these components.

If one considers the exemplary case of the radio-frequency coil arrangement, differentiation is frequently made between transmission modules and reception modules. For example, an analog reception module comprises an electronic with which the received signal is initially demodulated. The signal is additionally converted by an A/D converter into a reception digital signal. The reception digital signal is digitally demodulated and processed further in the digital reception module. The signal of a frequency generation unit (usually an NCO (Numerically Controlled Oscillator)) as well as an intermediate frequency is required for this. Such reception modules can process, for example, a specific number of reception channels.

In order to have to adhere to the predetermined time plan that is important for the measurement method, each component must implement specific actions at a precisely determined time, a central control concept is used in which the digital modules are integrated into the control computer. With the system clock of the control computer, and possibly a local clock or a timestamp, synchronization and iso-synchronizationare established. The digital modules can then be fashioned, for example, as modules that can be connected to a bus within the control computer.

Given such centrally organized control systems, a future maximum expansion must be taken into account in the design since the capacities of the control computer are limited both spatially and in terms of capacity. This maximum expansion, however, cannot be exactly planned for all system functionalities (thus components) at the point of time of the design since the technical developments proceed rapidly.

Under-equipages or even bottlenecks thus frequently occur in conventional control systems when the expansion possibilities are not sufficient.

Some niche solutions are known to address this problem. For example, it has been proposed to utilize a clone concept at the excitation side with regard to the radio-frequency coil arrangement, with which clone concept the control computer is duplicated multiple times, and one of the control computers is configured as a master, the others as slaves. This solution is technically very complicated and uneconomical and concerns only a partial aspect of one component. Such an individual solution is also known for the reception side, for which a bus expansion separate from the control computer is proposed. Again, a complete and economical solution of the aforementioned problem is not achieved.

SUMMARY OF THE INVENTION

An object of the present invention is to provide a magnetic resonance system that enables a larger and more cost-effective upgrade capability of the system.

This object is achieved by a magnetic resonance system of the aforementioned type wherein, in accordance with the invention, the digital modules are arranged externally to the control computer and are associated with the analog modules controlled by the control computer, and a data network is provided for communication between the digital modules and the control computer, and a synchronous network is provided for synchronization of the digital modules and the control computer.

In contrast to the known prior art, the digital modules are arranged remotely and externally from the control computer, for example in a separate housing. A spatial association with the analog module or modules controlled by the control computer is thereby provided. According to the invention, a transition is made from a centralized arrangement (as is conventional) to a decentralized arrangement. The previously known bus system is not used and instead a network system is used so that a nearly unlimited, cost-effective expansion capability of the system is enabled, that limited only by the bandwidth of the corresponding network. However, it can also be provided with particular advantage for the networks to be designed in a scalable manner. The limitation due to the bandwidth of the network is then also remedied.

As already mentioned, observance of the precise temporal workflow in a magnetic resonance system or, respectively, its observance is particularly critical. In the inventive configuration, the control computer ultimately acts as a communication node that decodes the information about the next occurring sequence and divides said information into individual control commands for the respective components, which individual control commands in principle contain the instruction of what is to be done and when. So that the "when" (timing) is identically interpreted by each of the digital modules (so a correct sequence is enabled), a common system clock must exist between the control computer and the digital modules and a reference time must be provided. The synchronization of the digital modules is achieved by the synchronous network that is provided in addition to the data network via which the control commands (and naturally also measurement data, for example) are transferred. Through the synchronization and the identical reference time it is then also possible to control the aforementioned frequency generation units (in particular NCOs) with suitable control commands that contain the parameterization and the point in time of the start, such that the coherency conditions that are critical for magnetic resonance measurements are met.

The data network can be fashioned with particular advantage as a partially isochronous, or completely isochronous, network. Care must therefore be taken that certain data are exchanged between the network nodes within a specific time span. This is enabled with such a partially isochronous or completely isochronous network. A partially isochronous network exists when, for example, the iso-synchronization is not required for specific components. In an isochronous network, or the isochronous portion of a partially isochronous network it is ensured that data have reached their destination location (here their destination digital module or the control computer) within a specific, periodic time window. Such a time clock pulse can, for example, be 10 µs or 10 ms. All existing digital modules must then have received their corresponding information from the network within such a time window. In a data network with a ring topology this can be the time in which a data packet traverses the entire ring, with the corresponding digital modules obtaining their information when the data packet passes through them. In this context it is important for the control commands to have accordingly already reached the corresponding digital modules before the point in time of their execution in every case, so they are valid as of the arrival of the point in time.

At least one digital module can be installed in an external work unit (in particular a power amplifier) together with the at least one analog module controlled by this said digital module. An external apparatus then structurally combines one or more digital modules and the associated analog modules. In the example of the gradient coils or the excitation side of the radio-frequency coils the digital modules are accommodated in the power amplifier housings that are present anyway.

The synchronous network can appropriately have a synchronization module arranged in the control computer, this synchronization module controlling synchronization units arranged via synchronization lines in the digital modules or the work unit. The synchronization module in the control computer accordingly provides the signals that are distributed via the lines to the corresponding synchronization units. In particular, a system clock pulse generated by the synchronization module can be transferred via the synchronization network. Such a system clock pulse (which can be, for example, 10 MHz) is already utilized in the central arrangements in the prior art. If the digital modules and the control computer are accordingly synchronized to the same system clock, the known electronics can thus be used to better advantage than if it were arranged in the control computer.

In an embodiment, the time clock pulse of the data network fashioned as a partially isochronous or completely isochronous network is an integer multiple of the system clock pulse. The interference signals caused by the isochronous network can thereby be more easily suppressed. Additionally, no data gap between the transmitting unit and the receiving unit can arise in an isochronous network. In a further embodiment it is also possible for the clock rate of the at least partially isochronous network to precisely correspond to the system clock. For example, control commands can then be delivered to the various digital modules within one system clock and retain their validity during the following system clock pulse. Further time references in addition to the system clock are no longer necessary in this case since the system clock pulse itself can serve as a timestamp.

In order to achieve a time reference and to enable control commands to be executed at the correct point in time, a number of embodiments are available in the inventive magnetic resonance system. In principle, differentiation can be made between a timestamp that is transferred within one of the networks, and timers (in particular clocks) in the individual digital modules or synchronization units and the synchronization module, which timers run synchronously and are set to the same time at a specific point in time.

A timestamp for establishing a reference point in time can be transferred in addition to the system clock. The transfer of this timestamp (which can ensue, for example, in regular (periodic) intervals) can inventively be realized in different ways. The timestamp can be modulated to the system clock. In this case a suitable filter arrangement that enables the separation is provided in the receiver module. Alternatively, the timestamp can be embodied as an amplitude increase of the system clock pulse. This has the advantage that no interfering influence on the phase of the system clock pulse occurs. In order to entirely avoid such interfering influences, the synchronous network can have first synchronization lines for transfer of the system clock pulse and second synchronization lines for transfer of the timestamp. In a further alternative, the timestamp can be transferred via the data network. In this case, however, it must be ensured that the respective timestamp simultaneously reach the digital modules (possibly within a small, allowed temporal tolerance) so that the sequence workflow and the coherency conditions can be upheld. Such a realization is suitable when the data network exhibits a star topology.

In the alternative embodiment already mentioned, the digital modules or synchronization units as well as the synchronization module each can include a timer, with all timers being synchronized via the synchronous network, and set to the same time via the synchronous network or the data network. A "global" time is thereby established in the entire control system, so the validity points in time contained in the control commands are specified using this time. For setting of the same time, a reset signal for synchronous restarting of all timers can be transferred, and a time signal representing a time also can be transferred, with the timers being set to the time. The transfer of the signals can ensue in the same manner as for the transfer of the timestamps. Thus the signal or signals are modulated to the system clock pulse, or are realized as an amplitude increase of the system clock pulse, and the synchronous network has first synchronization lines for transfer of the system clock pulse and second synchronization lines for transfer of the signal or signals, or the signal or signals can be transferred via the data network.

It is also possible for the control computer to be fashioned for calibration of the timer using an adjustment algorithm and a network. Such adjustment algorithms are convergent algorithms that lead to the situation that all timers in a system indicate an identical value. An example of such an algorithm is described in the following. A learning phase is started upon activation of the magnetic resonance system or the network. The control computer then dispatches the current timer state (thus the current time) to the digital modules. The digital modules set their timers to the incoming time and send back their current time to the control computer. This compares the incoming time with its time and determines the difference, after which half of the difference is added to its current time and the obtained value is dispatched to the digital modules. These in turn set their timers to the incoming time and send the updated time back to the control computer. This adds the difference determined above and compares it with its current time. In the event that a difference still exists, half of the difference is again added to its time and the value is dispatched to the digital modules. These steps can be further iterated if necessary until all timers proceed in sync after a few cycles and indicate the identical value.

An ideal adherence to all temporal conditions is therefore possible by means of a data network fashioned as an isochronous network and a synchronous network. All critical components are controlled approximately simultaneously via the isochronous network. The final synchronization is then ensured by the system clock and either the timestamp or the time of the timer. In such a system it is also possible to suitably control the present (now distributed) frequency generation units (in particular NCOS) such that the frequency and phase conditions of the radio-frequency signals (thus the coherency conditions) are ensured.

In order to avoid different delays in the synchronous network, the synchronous network can exhibit a star topology. This is ideally suited to optimally prevent different delays. For example, such a star topology can be realized by at least one splitter with which the signal can be simultaneously provided on different lines.

The data network can exhibit a tree topology or a ring topology or a star topology. A ring topology is typically used due to the lower connection expenditure.

In addition to the already cited components, a shim system and/or a monitoring system and/or a coil interface can furthermore be provided as components. Further components that are activated into the operation of the magnetic resonance system can be integrated without problem into the inventive control system.

DESCRIPTION OF THE PREFERRED EMBODIMENTS

Figure 1:
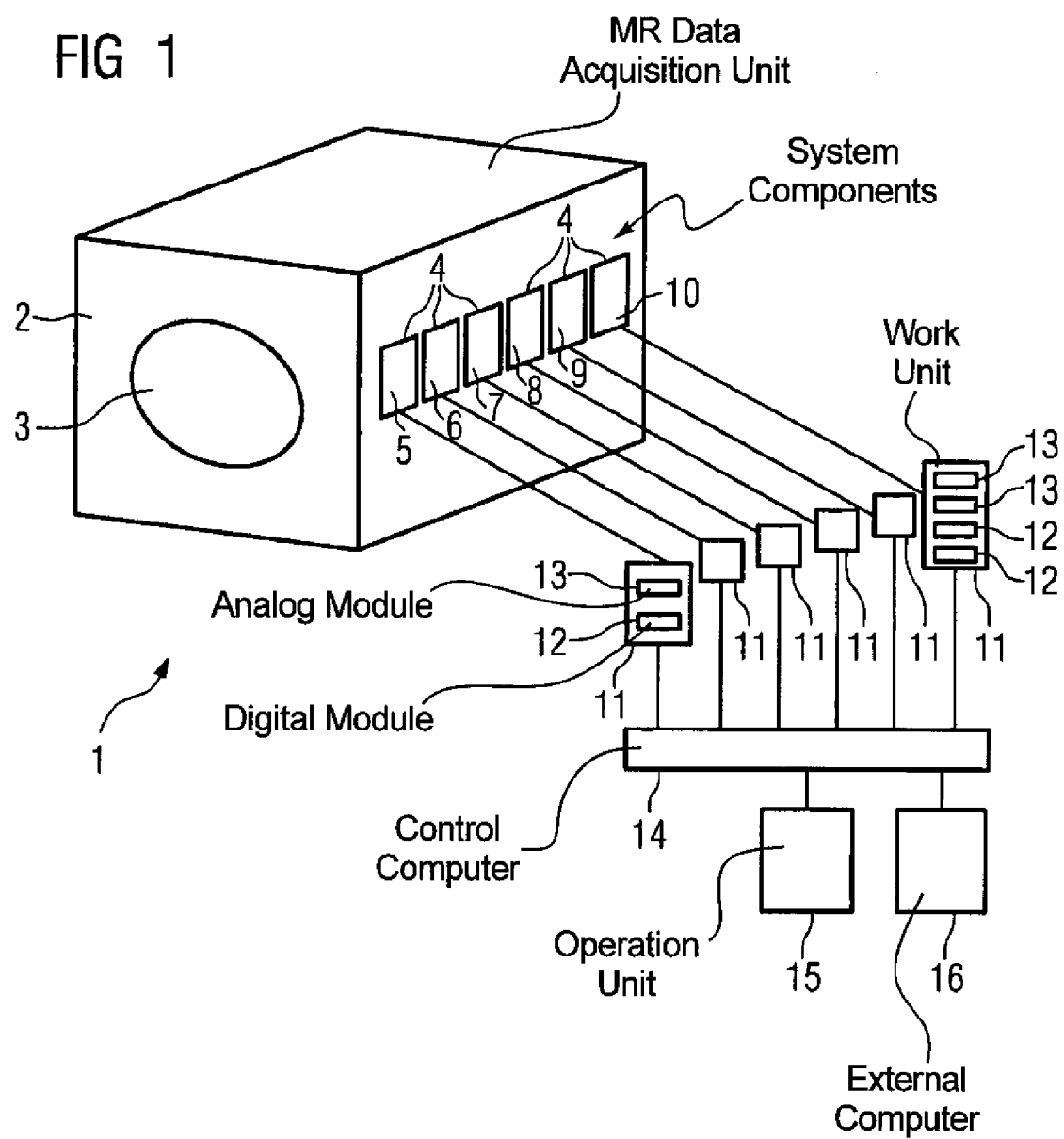
FIG. 1 schematically illustrates an inventive magnetic resonance system.

FIG. 1 schematically shows an inventive magnetic resonance system 1. It has an MR data acquisition unit 2 in which the patient receptacle 3 is also fashioned, in which patient receptacle 3 an optimally homogeneous field is generated in the isocenter. Furthermore, the magnetic resonance system 1 has a number of system components 4 that are shown only schematically. The components 4 in this case include a magnetic field generation unit 5, gradient coil 6, a radio-frequency coil arrangement 7, a shim system 8 for improvement of the homogeneity of the magnetic field, a monitoring system 9 for general monitoring tasks as well as a coil interface 10. A work unit 11 is respectively associated with the components 4 in this case. Configurations are also conceivable in which a number of components 4 are associated with a work unit 11 or a number of work units 11 are associated with a component 4. The work units 11 represent various units such as control units, supply units, measurement units and the like. At least one digital module 12 and at least one analog module 13 associated with this digital module 12 are respectively embodied in the work units 11, which modules control the components 4 according to a sequence. For clarity, the analog and digital modules 12, 13 are shown only in the outer two of the presented work units 11. The work units can also fulfill further functions. For example, the work units 11 for the radio-frequency coil arrangement 7 and/or the gradient coils 6 can be the corresponding power amplifiers.

A control computer 14 is additionally provided that, for example, receives the sequence to be implemented from outside, for example from an operation unit 15 or an external computer 16.

The digital modules 12 are clearly arranged external to the control computer 14 and associated with the analog modules 13 controlled by them (in this case installed in a common work unit 11). For communication, the digital modules 12 and the control computer 14 form two networks, namely a data network and a synchronous network that should now be explained in detail for various exemplary embodiments with reference to FIGS. 2 through 4.

Figure 2:
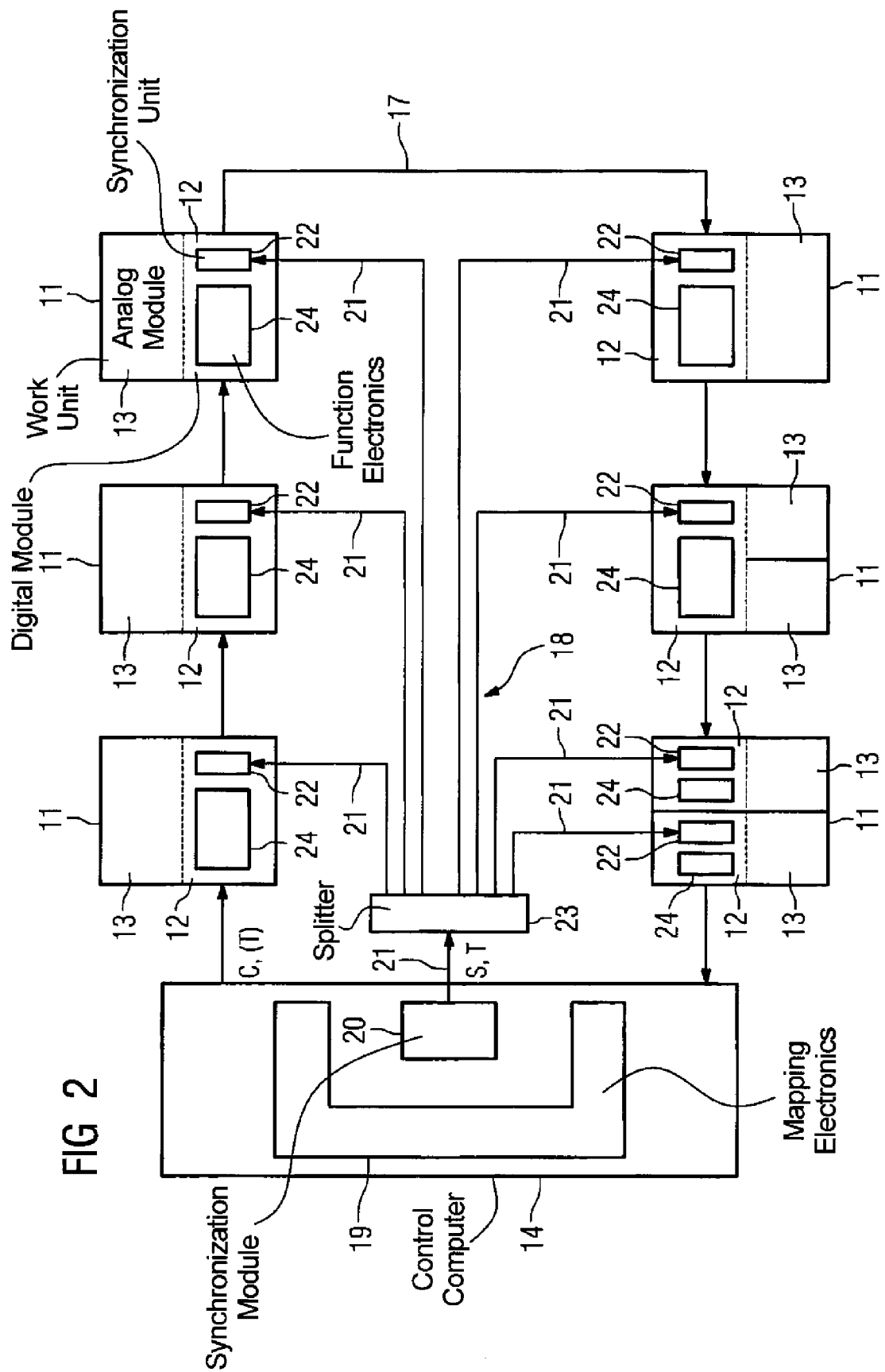
FIG. 2 illustrates the control system of the inventive magnetic resonance system according to a first embodiment.

FIG. 2 shows the control system of a magnetic resonance system 1 according to a first embodiment. The control computer 14 is networked with the digital modules 12 via two different networks, namely an isochronous data network 17 with a ring topology and a synchronous network 18 with a star topology.

At least one analog module 13 and at least one digital module 12 are embodied in each work units 11. Possible other configurations (namely the presence of two digital modules 12 with respectively associated analog module or the presence of one digital module 12 with two associated analog modules 13) are shown in the work units 11 arranged to the left in the lower row. Other configurations are naturally also conceivable.

It is thus possible, for example, to respectively associate various function units comprising at least one digital module 12 and at least one analog module 13 with various reception channels, whereby each of these function units can be arranged in a work unit 11. Such reception function units are frequently designated with "RX", transmission units with "TX". It is also conceivable to arrange all of these function units in a single work unit 11. Furthermore, it is also possible to control a number of components 4 with one digital module 12, such that then only one work unit 11 is also associated with these components 4. An arbitrary distribution of the individual functions to the individual digital modules 12 and work units 11 is accordingly possible, whereby these functions are all remote from the control computer 14.

In the control computer 14, mapping an electronics 19 are provided that map the sequence (composed of what are known as objects) to suitable control commands C that are sent to the digital modules 12 via the isochronous data network 17. Objects are definitions of the desired behavior of a component 4 at this point in time.

So that these points in time (which are critical for the function of the magnetic resonance system 1) can be observed, an identical system clock S must exist in the control computer 14 and the digital modules 12, as well as a reference time that determines when a control command C is valid. In order to achieve the synchronization, the synchronous network 18 is provided. It has a synchronization module 20 arranged in the control computer 14, which synchronization module 20 has a clock pulse emitter that generates the system clock S, for example with a frequency of 10 MHz. The system clock pulse S is related to synchronization units 22 in the individual digital modules 12 via synchronization lines 21. Due to the star topology of the synchronous network 18, these signals also arrive in the synchronization units 22 (which all supply the system clock pulse S) at the same times. The synchronization units 22 are here contained in the digital modules 12; but in the event that a number of digital modules 12 are present in a work unit 11, this work unit 11 has only one synchronization unit 22.

The star topology of the synchronous network 18 is enabled via a splitter 23. A number of cascaded splitters can be provided.

The isochronous data network 17 transfers the control commands C to the digital module 12 that comprises a dedicated electronic 24 for execution of the desired functions. For example, the electronics 24 can be an NCO (in particular in the case of transmission and reception systems). A control command with regard to the NCO would then, for example, contain its parameterization and the point in time at which it should be started with this parameterization. The control commands C are dispatched via the isochronous data network 17 such that in every case they reach the corresponding digital module 12 before the point in time of their execution or validity. This is achieved by the isochronicity of the data network 17, in which here a ring passage is concluded within a periodically recurring time interval (the time clock pulse of the isochronous network 17). In the shown example the control commands C are sent through the ring in the clockwise direction, whereby each digital module 12 successively extracts its control commands C and other data and possibly even provides data to the ring. The time clock pulse of the isochronous data network 17 is then essentially determined from one pass through the ring.

So that the control commands C are also executed at the correct point in time, in the exemplary embodiment according to FIG. 2 a timestamp T is also transferred. This represents a reference point in time using which it can be determined when the control commands C are valid. The timestamp T is thereby also transferred via the synchronous network 18. It can either be modulated to the system clock S or can be encoded as an amplitude variation of the system clock pulse S. In the first case filters are still required in the synchronization units 22 in order to split the signals again. Theoretically it is also possible to transfer the timestamps T via the data network 17; but a star topology would then be more suitable so that the time stamp T can reach all digital modules 12 at the same time.

The time clock pulse of the isochronous data network 17 corresponds to an integer multiple of the system clock pulse S. Interference effects are thus reduced. It is also theoretically conceivable that the time clock pulse of the isochronous data network 17 corresponds to the system clock pulse S. Control commands that should be executed during the next system clock pulse S are transferred within this system clock pulse S, whereby the system clock pulse S itself can serve as a reference time. No timestamp T would then be required.

In the following further exemplary embodiments, identical reference characters designate identical components of the control system. For simplicity only the altered characteristics are described.

Figure 3:
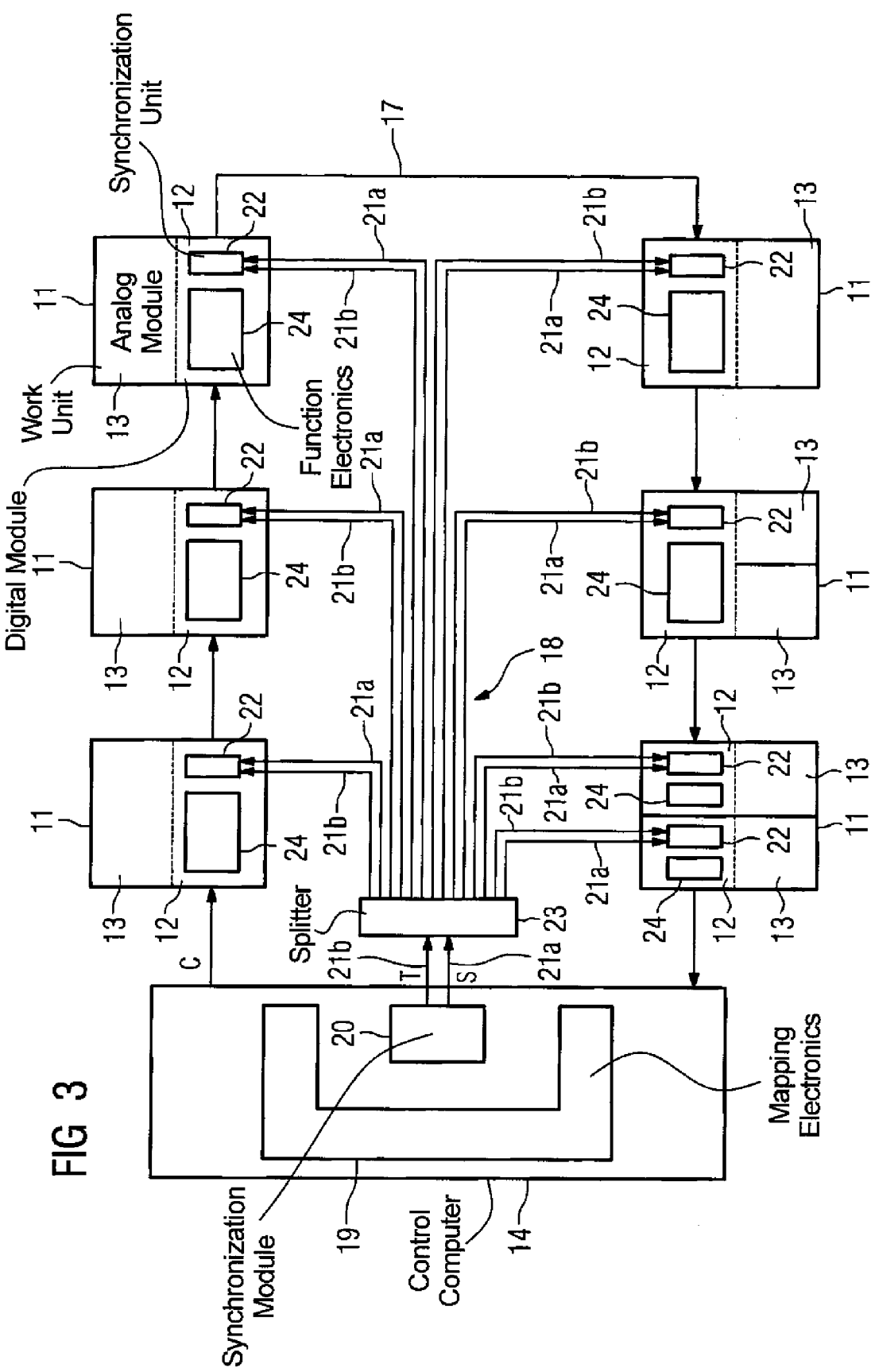
FIG. 3 illustrates the control system of an inventive magnetic resonance system according to a second embodiment.

The exemplary embodiment of FIG. 3 differs from the exemplary embodiment of FIG. 2 only in the manner of the transfer of the timestamp T. The synchronization lines here comprise first synchronization lines 21a that serve for transfer of the system clock pulse S and second synchronization lines 21b that serve for the transfer of the timestamp T. No interfering influence on the system clock pulse S can therewith occur.

Figure 4:
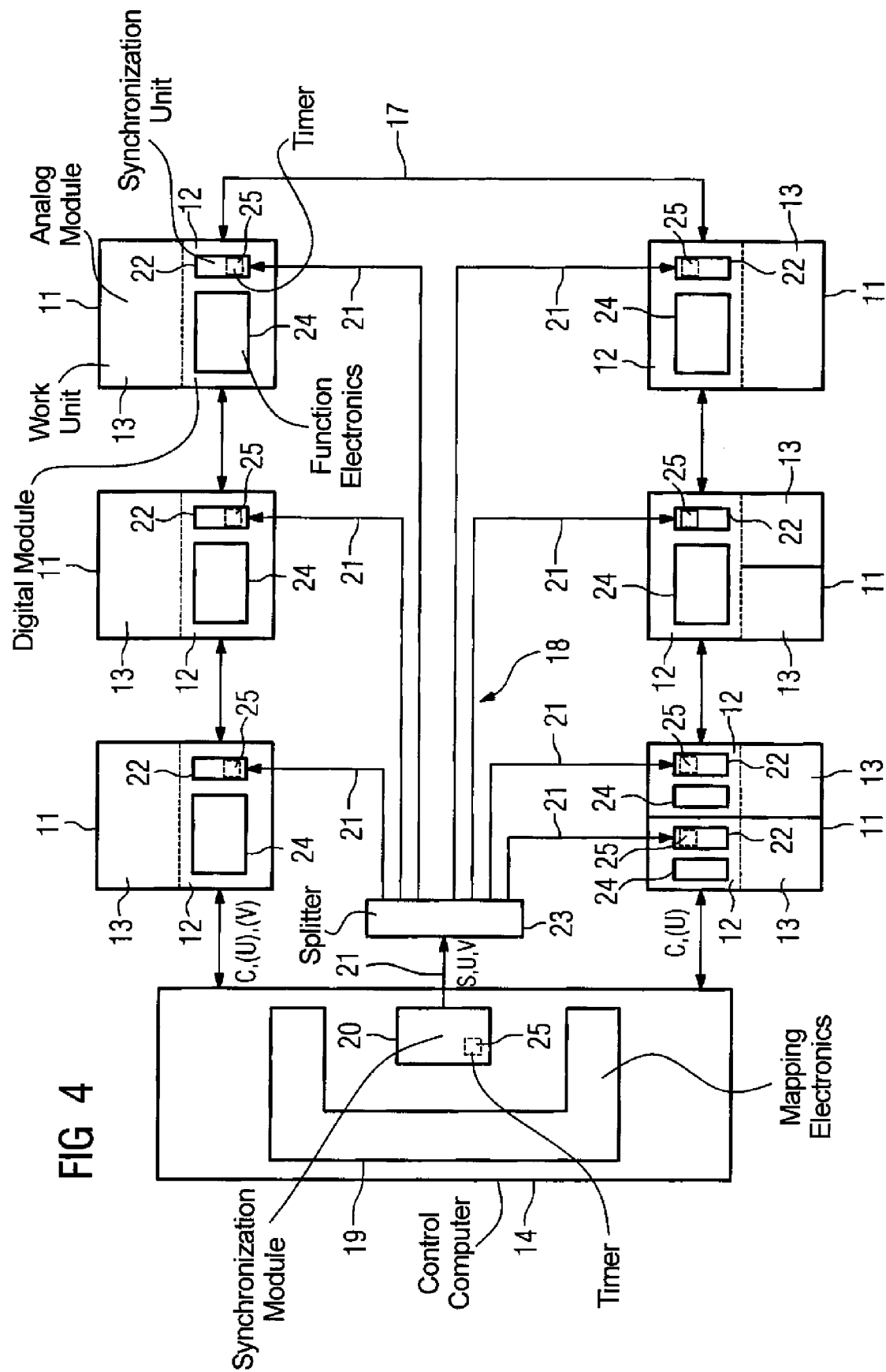
FIG. 4 illustrates the control system of an inventive magnetic resonance system according to a third embodiment.

A third exemplary embodiment is shown in FIG. 4. The isochronous data network 17 there is fashioned not as a ring but rather a bidirectional network with a tree topology with two branches. For example, the lower branch can be fashioned for reception tasks, the upper branch for transmission and other tasks.

The synchronization units 22 of the digital modules 12 now additionally comprise a timer 25; a further timer 25 is provided in the synchronization module 20 of the control computer 14. The control system is henceforth fashioned such that the timers 25 are all synchronized with one another and indicate the same time. For this purpose, a reset signal U and a time signal V can be transferred to the timers 25 of the synchronization units 22 via the synchronous network 18. A reset signal U resets the timers 25 so that they all restart. A time signal V comprises a time to which the timers 25 are set. An equalization of the timers 25 is thus possible. The synchronization ensues again via the system clock pulse S.

Naturally, it is also possible to transfer the signals U, V via the isochronous data network 17. Alternatively, first synchronization lines 21a can be provided for the system clock pulse 21 and second synchronization lines 21b for the signals U, V, shown in FIG. 3.

The equalization of the clocks does not have to ensue via the signals U, V as shown here; rather, an adjustment algorithm (in particular operating via the data network 17) can also be used, whereby any convergent algorithm can be used.

In all exemplary embodiments the networks 17, 18 are designed such that they can be scaled so that they can be arbitrarily expanded in terms of their bandwidth.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance system comprising:
    a plurality of components including a magnetic field generation unit that generates a basic magnetic field, gradient coils that generate respective field gradients, and a radio-frequency coil arrangement comprising a plurality of radio-frequency coils for transmission and reception of radio-frequency signals;
    a control computer that emits a control sequence for operating said components to execute a magnetic resonance examination;
    at least one digital module and at least one analog module controlled by said digital module connected between said control computer and said components, that serve to transfer said control sequence from said control computer to said components;
    said at least one digital module and said at least one analog module being physically associated with each other externally of said control computer;
    a data network serving for communication between said at least one digital module and said control computer; and
    a synchronous network that synchronizes the digital modules and the control computer.

2. A magnetic resonance system as claimed in claim 1 wherein said data network is a partially isosynchronous data network.

3. A magnetic resonance system as claimed in claim 1 wherein said data network is a completely isosynchronous network.

4. A magnetic resonance system as claimed in claim 1 comprising an external functional unit in which said at least one digital module and said at least one analog module controlled by said at least one digital module are installed.

5. A magnetic resonance system as claimed in claim 4 wherein said external functional unit is a power amplifier.

6. A magnetic resonance system as claimed in claim 4 wherein said synchronous network comprises a synchronization module in said control computer, and a synchronization unit in said at least one digital module or said functional unit, said synchronization module being connected to said at least one synchronization unit by a synchronization line.

7. A magnetic resonance system as claimed in claim 6 wherein said synchronization module generates a system clock pulse that is transferred via said synchronous network.

8. A magnetic resonance system as claimed in claim 7 wherein said data network is an at least partially isosynchronous data network, and operates with a time clock pulse that is an integer multiple of said system clock pulse.

9. A magnetic resonance system as claimed in claim 7 comprising generating a time stamp in said synchronization module that is additionally transferred via the synchronous network.

10. A magnetic resonance system as claimed in claim 9 wherein said synchronization module generates said time stamp by an action selected from the group consisting of modulating the time stamp to the system clock pulse and increasing an amplitude of the system clock pulse.

11. A magnetic resonance system as claimed in claim 9 wherein said synchronous network comprises first synchronization lines that transfer the system clock pulse and second synchronization lines that transfer the time stamp.

12. A magnetic resonance system as claimed in claim 7 wherein in each of said synchronization module and said at least one synchronization unit comprises a timer, the respective timers being synchronized via the synchronous network and being set to a same time via a network selected from said synchronous network and said data network.

13. A magnetic resonance system as claimed in claim 12 comprising generating a reset signal in said synchronization module and transferring said reset signal to each of said timers for synchronously restarting each of said timers.

14. A magnetic resonance system as claimed in claim 12 wherein said synchronization module generates a time signal that is transferred to the respective timers to set the time of the respective timers.

15. A magnetic resonance system as claimed in claim 14 wherein at least one said reset signal or said time signal is generated by an action selected from the group consisting of modulating the signal to the system clock pulse or increasing an amplitude of the system clock pulse.

16. A magnetic resonance system as claimed in claim 14 wherein said synchronous network comprises first synchronization lines that transfer the system clock pulse and second synchronization lines that transfer at least one of said reset signal or said time signal.

17. A magnetic resonance system as claimed in claim 14 wherein at least one of said reset signal and said time signal is transferred via said data network.

18. A magnetic resonance system as claimed in claim 12 wherein said control computer adjusts the respective timers using an adjustment algorithm via the selected network.

19. A magnetic resonance system as claimed in claim 1 comprising transferring a time stamp via said data network that marks a reference point in time for said components.

20. A magnetic resonance system as claimed in claim 1 wherein said data network and said synchronous network are each scalable networks.

21. A magnetic resonance system as claimed in claim 1 wherein said synchronous network has a star network topology.

22. A magnetic resonance system as claimed in claim 1 wherein said data network has a network topology selected from the group consisting of a tree topology, a ring topology, a star topology, and a combination of at least two of tree topology, a ring topology and a star topology.

23. A magnetic resonance system as claimed in claim 1 wherein said components further comprise at least one of shim system, a component monitoring system, and a coil interface.

* * * * *